US008180976B2

(12) United States Patent
Jeong et al.

(10) Patent No.: US 8,180,976 B2
(45) Date of Patent: May 15, 2012

(54) PROGRAMMING NON-VOLATILE MEMORY DEVICES BASED ON DATA LOGIC VALUES

(75) Inventors: Jae-Yong Jeong, Gyeonggi-do (KR); Heung-soo Lim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 1544 days.

(21) Appl. No.: 10/982,560

(22) Filed: Nov. 5, 2004

(65) Prior Publication Data

US 2006/0004970 A1    Jan. 5, 2006

(30) Foreign Application Priority Data

Jul. 5, 2004  (KR) .................... 10-2004-0052076

(51) Int. Cl.
*G06F 12/00*  (2006.01)
(52) U.S. Cl. ..................................... 711/154
(58) Field of Classification Search .............. None
See application file for complete search history.

(56) References Cited

U.S. PATENT DOCUMENTS

| 5,430,674 A | 7/1995 | Javanifard |
| 6,597,605 B2 * | 7/2003 | Kreifels et al. .......... 365/185.28 |
| 6,937,524 B2 * | 8/2005 | Shiga et al. ............... 365/185.3 |
| 2002/0122347 A1 * | 9/2002 | Frulio et al. .................. 365/233 |

FOREIGN PATENT DOCUMENTS

| JP | 10-289592 | 10/1998 |
| KR | 10-1998-005384 | 2/1998 |
| KR | 10-1998-0702619 | 4/1998 |

OTHER PUBLICATIONS

Office Action, German Patent Application No. 10 2005 032 484.33-55, Aug. 20, 2008.

* cited by examiner

*Primary Examiner* — Duc Doan
(74) *Attorney, Agent, or Firm* — Myers Bigel Sibley & Sajovec, P.A.

(57) ABSTRACT

A nonvolatile memory device includes a memory cell array, a data scanning unit, and a program unit. The memory cell array includes a plurality of memory cells, where each of the memory cells is programmable to store data have a first logic value or a second logic value. The data scanning unit is configured to search among a plurality of data to be programmed in the memory cells to identify data having the second logic value. The program unit is configured to group the identified data having the second logic value, and to program at least a portion of the group of identified data at a same time into the memory cells.

17 Claims, 7 Drawing Sheets

PROGRAMMING NON-VOLATILE MEMORY DEVICES BASED ON DATA LOGIC VALUES

CROSS-REFERENCE TO RELATED APPLICATIONS

This U.S. non-provisional patent application claims priority under 35 U.S.C. §119 of Korean Patent Application No. 10-2004-0052076 filed on Jul. 5, 2004, in the Korean Intellectual Property Office, the disclosure of which is herein incorporated by reference in its entirety.

FIELD OF THE INVENTION

The present invention relates to nonvolatile memory devices, and more specifically to programming of memory cells in nonvolatile memory devices.

BACKGROUND OF THE INVENTION

Nonvolatile memory devices are widely used in computers, memory cards, and other electronic devices because they can retain data after removal of a power supply. Flash memory is one type of nonvolatile memory device.

Flash memory can be categorized as a NOR or NAND memory type device based on how its memory cells are connected to bit lines. In a NOR type flash memory, two or more memory cell transistors are connected in parallel to one bit line. The NOR type flash memory can store data by a channel hot electrode method, and can erase data through Fowler-Nordheim tunneling (F-N tunneling). In a NAND type flash memory, two or more memory cell transistors are connected in serial to one bit line. The NAND type flash memory stores and erases data through F-N tunneling.

NOR type flash memories can be less suitable for use in high integration density devices due to their larger dissipation of current than NAND type flash memories. Consequently, NAND type flash memories may be more easily integrated into higher density devices.

A cell array in a NOR type flash memory can include a plurality of banks, where each of the banks includes a plurality of sectors, and each of the sectors includes a plurality of memory cells. An erase operation of a NOR type flash memory may be carried out in groups of sectors, and a programming operation may be performed in groups of words (or bytes).

To program data into the cell array of a NOR type flash memory, a program command is issued to the flash memory. Then, addresses and data to be programmed are provided to the flash memory. The addresses and data are temporarily stored in the memory chip, and memory cells that corresponds to the program addresses are selected. A voltage that correspond to the program data is applied to bit lines that correspond to the selected memory cells, which programs the data into the memory cells of the memory device. When a predetermined program operation execution time elapses, a verify operation is performed, which determines whether each of the data is correctly programmed in a selected memory cell. The program and verify operations are repeated until the data is correctly programmed in the selected cell.

With the channel hot electrode method of programming a NOR type flash memory, a high voltage of about 4V to 6V can be applied to a drain of the memory cell. The high voltage that is applied to the drain is usually generated through a charge pump within the memory chip, which can limit the number of memory cells (i.e., memory bits) that can be simultaneously programmed to, for example, 2 to 4 memory cells. When the number of memory cells that can simultaneously programmed is limited to four, then 16-bit data can be divided into four groups of four bits, and programmed into the memory cells through four sequential programming operations.

Before a flash memory is programmed, a portion of addressed memory cells should be erased by setting it to a logic "1" value. Memory cells are then programmed by either leaving their logic value as "1", or by switching their logic value to "0".

SUMMARY OF THE INVENTION

In some embodiments of the present invention, a nonvolatile memory device includes a memory cell array, a data scanning unit, and a program unit. The memory cell array includes a plurality of memory cells, where each of the memory cells is programmable to store data have a first logic value or a second logic value. The data scanning unit is configured to search among a plurality of data to be programmed in the memory cells to identify data having the second logic value. The program unit is configured to group the identified data having the second logic value, and to program at least a portion of the group of identified data at a same time into the memory cells.

In some further embodiments of the present invention, the data scanning unit is configured to search among the plurality of data to identify data having the second logic value responsive to scan clock signals. The program unit is configured to program a number (N) data at a same time into the memory cells, and to carry out the programming of the group of identified data based on the group of identified data containing N data.

The program unit may include a sensing unit configured to read data from selected ones of the memory cells that have been programmed, and to determine whether the read data has the second logic value. The data scanning unit is configured to search among a plurality of data, to be reprogrammed in the memory cells, to identify data having the second logic value and which correspond to the read data having the first logic value. The program unit is configured to program a number (N) data at a same time into the memory cells, to form a group of data to be reprogrammed, which were identified by the data scanning unit as having the second logic value and corresponding to the read data having the first logic value, and to carry out reprogramming of the group of data into the memory cells when the group of data to be reprogrammed contains N data.

The data scanning unit may include a scan clock generating unit and a data latch unit. The scan clock generating unit is configured to generate a plurality of scan clock signals in response to an internal clock signal. The data latch unit is configured to search among the plurality of data and to store data having the second logic value responsive to the plurality of scan clock signals. The scan clock generating unit can be configured to stop generation of the scan clock signals for a predetermined program time based on a determination that the number of searched data is equal to the number of data that the program unit can program at a same time into the memory cells. The scan clock generating unit can be configured to sequentially activate each of the scan clock signals at predetermined intervals.

The data latch unit may include a data detecting unit and a data storage unit. The data detecting unit is configured to determine for each of the data to be programmed whether the data has the first logic value or the second logic value responsive to the scan clock signals and to generate an output signal based thereon. The data storage unit is configured to store data having the second logic value based on the determination by the data detecting unit, and to output a bit line active signal that activates a bit line corresponding to the stored data. The data detecting unit can be configured to determine for each data to be reprogrammed whether the data has the first logic value or the second logic value. The data storage unit may include a T-flip flop that is configured to receive the output signal from the data detecting unit as a clock input and to output the bit line active signal based on the result signal.

The program unit may include a program bit counter, a program control unit, and a program driver. The program bit counter can be configured to count a number of data having the second logic value in response to the output signal from the data latch unit and the scan clock signals. The program control unit can be configured to control programming of data into a memory cell that corresponds to the activated bit line in response to the number of data counted by the program bit counter as having the second logic value. The program driver can be configured to program a number (N) of the data stored in the data latch into the memory cells at a same time.

The program bit counter may be configured to stop counting when a number of counted data having the second logic value is equal to a number of data that the program unit can program into the memory cells at a same time. The program control unit may be configured to cause the program unit to program data into the memory cells via a program execute signal when the program bit counter has counted a number of data having the second logic value that is equal to a number of data that the program unit can program into the memory cells at a same time.

The program bit counter may include a data input unit, a counter unit, a data output unit, and a reset control unit. The data input unit can be configured to receive an indication from the data scanning unit of data identified as having the second logic value. The counter unit can be configured to increment a count of a number of data having the second logic value to be programmed at the same time into the memory cells. The data output unit can be configured to output an activated synchronous program active signal response to the value counted by the counter unit is equal to a number of data that the program unit can program into the memory cells at a same time or responsive to an indication that a last scan clock signal has been received by the program unit. The reset control unit can be configured to reset the data latch unit based on the program execute signal generated by the program control unit, and to reset the counter unit based at least in part on the program execute signal.

Some other embodiments of the present invention provide a method of programming data, having a first logic value or a second logic value, into a plurality of memory cells in a nonvolatile memory device. A plurality of data to be programmed into the memory cells is searched to identify data having the second logic value. The identified data having the second logic value are grouped. At least a portion of the group of identified data are programmed at a same time into the memory cells.

In some further embodiments of the present invention, the nonvolatile memory device is configured to program a number (N) data at a same time into the memory cells. Data in the group of identified data are programmed N data at a time into the memory cells. A determination may be made as to when the group of identified data contains N data, and the programming of at least a portion of the group of identified data at a same time into the memory cells can be carried out responsive to the determination that the group of identified data contains N data.

In some other embodiments of the present invention, the nonvolatile memory device includes a memory cell array, a data scanning unit, and a program unit. The memory cell array includes a plurality of memory cells. The data scanning unit searches and stores the data having the second value from the plurality of program data in response to a plurality of scan clock signals in synchronization with an internal clock of a specific period. The program unit groups the data identified from the search by the data scanning unit in groups of the number of data that can be programmed at the same time into the memory cells (maximum number of synchronous program bits). The program unit programs a plurality of data included in a corresponding group at a same time, whenever the number of searched data is equal to the maximum number of synchronous program bits.

In a further embodiment of the present invention, the data scanning unit includes a scan clock generating unit and a data latch unit. The scan clock generating unit generates the plurality of scan clock signals in response to the internal clock signal. The data latch unit searches and stores the data having the second value from the plurality of program data in synchronization with the plurality of scan clock signals.

The program unit may include a program bit counter, a program control unit and a program driver. The program bit counter counts the number of data having the second value in response to the result searched by the data latch unit and the plurality of scan clock signals. The program control unit controls a program operation with respect to a memory cell corresponding to the activated bit line in response to the result counted by the program bit counter. The program driver programs the data stored in the data latch unit, in groups of length of the maximum number of synchronous program bits, into addressed memory cells at the same time.

DETAILED DESCRIPTION OF PREFERRED EMBODIMENTS

Figure 1:
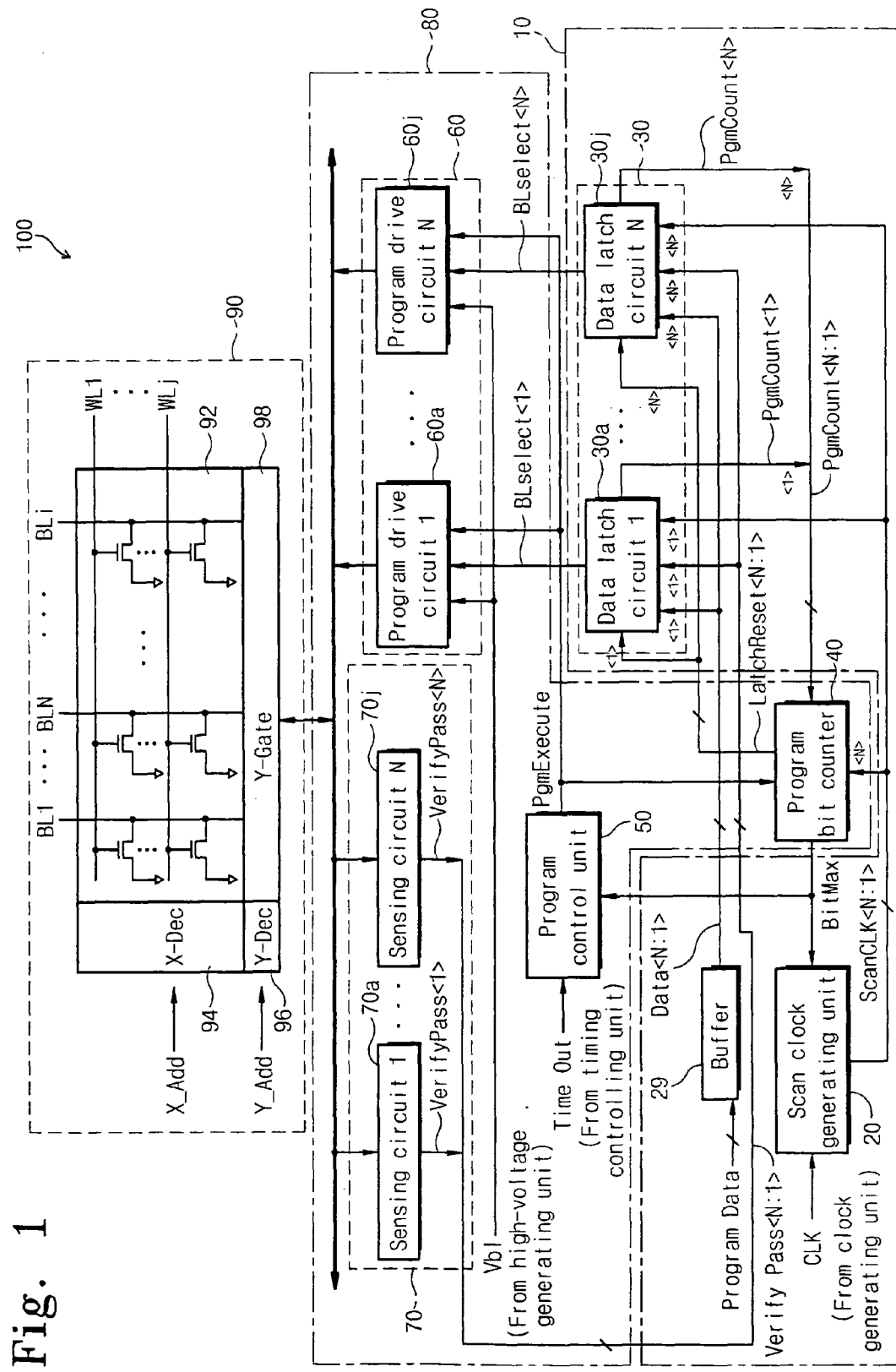
FIG. 1 is a block diagram of a nonvolatile semiconductor memory device in accordance with some embodiments of the present invention.

Certain embodiments of the present invention now will be described more fully hereinafter with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art.

It will be understood that when an element or layer is referred to as being "on", "connected to" or "coupled to" another element, it can be directly connected or coupled to the other element or intervening elements may be present. In contrast, when an element is referred to as being "directly connected to" or "directly coupled to" another element, there are no intervening elements present. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Moreover it is to be understood that the terms logic "0" value and logic "1" value are only used to distinguish one logic value from another. Accordingly, the term logic "0" value may be replaced with the term logic "1" value, and, similarly, the term logic "1" value may be replaced with the term logic "0" value. As used herein, the term "and/or" includes any and all combinations of one or more of the associated listed items.

The terminology used herein is for the purpose of describing particular embodiments only and is not intended to be limiting of the invention. It will be further understood that the terms "comprises" and/or "comprising," when used in this specification, specify the presence of stated features, integers, steps, operations elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A nonvolatile memory device of the present invention selects data having a logic "0" value from a plurality of data that are to be programmed into the memory device, and writes the selected data at a same time (e.g., synchronous program operation) into memory cells pf the memory device. Because the data is selected, and then programmed into the memory cells based on having a particular logic value, the time that is needed to program the data into the memory device may be reduced. As used herein, the term "a bit scanning program scheme" refers to the memory devices and associated methods for programming data into a memory device based in accordance with various embodiments of the present invention.

To program data in a nonvolatile memory device, such as a flash memory, corresponding addresses of memory cells that are to be programmed should be erased (i.e., the data should be set to a logic "1" value) before the cells are programmed. Programming of memory cells is performed by changing individual memory cells from a logic "1" value to a logic "0" value. Accordingly, memory cells that are not programmed will retain a logic "1" value. According to various embodiments of the present invention, a determination is made as to which data, if any, among data that is to be programmed in the memory device have logic "0" values, and those data are grouped, and at least a portion of the grouped data having the logic "0" values are programmed at a same time in the memory cells of the memory device. Accordingly, the time need to program data in the memory device may be reduced.

FIG. 1 is a block diagram of a nonvolatile semiconductor memory device 100 according to some embodiments of the present invention. Referring to FIG. 1, the nonvolatile semiconductor memory device 100 includes a data scanning unit 10, a program unit 80 and a memory cell array region 90.

The memory cell array region 90 includes a memory cell array 92, an X-decoder 94, a Y-decoder 96, and a Y-gate 8. The memory cell array 92 includes a plurality of memory cells connected to a plurality of bit lines BL1, ..., and BLi and a plurality of word lines WL1 ..., and WLj. The X-decoder 94 decodes a row address X_Add of the memory cell. The Y-decoder decodes a column address Y_Add of the memory cell. The Y-gate 98 performs a data interface operation between the memory cell array 92 and the program unit 80. The semiconductor memory device 100 in FIG. 1 is an example of a NOR type flash memory. However, it is to be understood that various embodiments nonvolatile memory devices other than the illustrated NOR type flash memory can be used in accordance with some embodiments of the present invention. The X-decoder 94 decodes a row address X-Add of the memory cell.

The data scanning unit 10 includes a scan clock generating unit 20 and a data latch unit 30. The data scanning unit 10 searches and stores data of logic "0" value from a plurality of program data Data<N:1> in response to N numbers of scan clock signals ScanCLK<N:1>.

The scan clock generating unit 20 generates N numbers of scan clock signals ScanCLK<N:1> synchronously with an internal clock signal CLK. The internal clock signal CLK is generated from a clock generating unit (not shown) included in the semiconductor memory device 100.

The data latch unit 30 includes N numbers of data latch circuits 30a, 30j of which circuit organizations are the same. Each data latch circuit 30a, ..., 30j receives one of N numbers of scan clock signals ScanCLK<N:1> from the scan clock generating unit 20, and one of N numbers of program data Data<N:1> from a buffer 29, to determine whether the received program data has a logic "1" or "0" value. When each of the data latch circuits 30a, ..., 30j maintains the value when the corresponding program data has a logic "0" value. Each data latch circuit 30a, ..., 30j generates a program count signal PgmCount<i> and a bit line selection signal BLselect<i> according to the result of the determination. For example, when the program data has a logic "0" value, the corresponding data latch circuit 30a, ..., 30j generates an activated program count signal PgmCount<i> and an activated bit line selection signal BLselect<i>. The N numbers of program count signals PgmCount<N:1> generated from the N numbers of data latch circuits 30a, ..., 30j are input to a program bit counter 40. The N numbers of bit line selection signals BLselect<N:1> generated from the N numbers of data latch circuits 30a, ..., 30j are input into corresponding program drive circuits 60a, ..., 60j, respectively.

The data latch circuits 30a, ..., 30j scan program data to search the data of logic "0" value not only during an initial programming but also during a reprogramming (i.e., a verify fail occurs). For this, each of the data latch circuits 30a, 30j receives a verify pass signal VerifyPass<i> from corresponding sensing circuits 70a, ..., 70j to determine whether the data of logic "0" value is scanned or not. For example, when the verify pass signal VerifyPass<i> indicates a verify fail, the corresponding data latch circuits 30a, ..., 30j carry out a bit scanning operation for searching a data of logic "0" value.

A program unit 80 includes a program bit counter 40, a program control unit 50, a program driver 60 and a sensing unit 70. The program unit 80 divides the data of logic "0" value, which is searched by the data scanning unit 10 into groups as many as the maximum number of synchronous program bits. Whenever the number of the searched data of logic "0" value is the same as that of the synchronous program bits, a plurality of data in a corresponding group are programmed simultaneously.

The program bit counter 40 receives N numbers of the program count signals PgmCount<N:1> generated from each of the data latch circuits 30a, . . . , 30j and counts the number of activated program count signals PgmCount<i> (i.e., the number of data of logic "0" value is counted). The program bit counter 40 generates a synchronous program activation signal BitMax when the counted value is the same as the number of the maximum synchronous program bits or the last scan clock signal ScanCLK<N> is input. The synchronous program activation signal BitMax is input to a scan clock generating unit 20 and a program control unit 50.

The scan clock generating unit 20 stops the generation of scan clocks while the program is performed, in response to the synchronous program activation signal BitMax generated from the program bit counter 40. The program control unit 50 generates a program execute signal PgmExecute and outputs the generated program execute signal PgmExecute to the program bit counter 40 and the program driver 60 in response to the synchronous program activation signal BitMax and a program timing control signal Time Out. The synchronous program activation signal BitMax is generated from the program bit counter 40 and the program timing control signal Time Out is generated from a timing controlling unit (not shown) included in the semiconductor memory device 100.

The program bit counter 40 resets the counted value of the program bit counter 40 in response to the program execute signal PgmExecute generated from the program control unit 50 while the data of "0" corresponding to the number of the maximum synchronous program bits is programmed. In addition, the program counter 40 generates a latch reset signal LatchReset for resetting each of the data latch circuits 30a, . . . , 30j.

The program driver 60 includes N numbers of program drive circuits 60a, . . . , 60j that have the same circuit organization. Each of the program drive circuits 60a, . . . , 60j corresponds to N numbers of data latch circuits 30a, . . . , 30j included in the data latch circuit 30 one to one and receives a bit line selection signal BLselect<i> generated from the corresponding data latch circuit 30a, . . . , 30j. Each of the program drive circuits 60a, . . . , 60j receives a program voltage Vb1 from a high voltage generating unit (not shown) in the semiconductor memory device 100, and a program execute signal PgmExecute generated from the program control unit 50. In addition, the program drive circuits 60a, . . . , 60j provides the program voltage for the corresponding bit line at the same time when the corresponding bit line selection signal BLselect<i> is activated.

The sensing unit 70 comprises N numbers of sensing circuits 70a, 70j having the same circuit organization. Each of the sensing circuits 70a, . . . , 79j performs a verify operation for identifying whether the program is completed or not by reading data from the corresponding bit line of the memory cell array 92 after the program is executed. Each of the sensing circuits 70a, . . . , 70j outputs the activated verify pass signal VerifyPass<i> to corresponding one of the data latch circuits 30a, . . . , 30j when the corresponding memory cell is confirmed to be programmed as a result of the verify. When the corresponding memory cell is confirmed not to be programmed, a verify pass signal VerifyPass<i> of low level is generated to corresponding one of the data latch circuits 30a, . . . , 30j. The verify pass signal VerifyPass<i> of low level means a verify fail.

In this case, an output terminal of the sensing circuit further include a comparator for comparing whether the data read from the corresponding bit line of the cell array 92 is identical to the data programmed by each of the program drive circuits 60a, . . . , 60j after the program is completed. In this case, each of the sensing circuits 70a, . . . , 70j identifies whether the programmed data is identical to the data read from after programming with the comparator. If it is identical, each of the sensing circuits 70a, . . . , 70j generates the activated verify signal VerifyPass<i> to the corresponding one of the data latch circuits 30a, . . . , 30j. If it is not identical, each of the sensing circuits 70a, . . . , 70j outputs the verify pass signal VerifyPass<i> at a low level that means a verify fail to the data latch circuits 30a, . . . , 30j.

As fully described above, if N numbers of scan clock signals ScanCLK<N:1> are generated from the scan clock generating unit 20, the latch unit 30 searches only data of logic "0" value to store in response to the scan clock signal ScanCLK<N:1>, N numbers of program data Data<N:1> transmitted from the buffer 29 and a verify pass signal VerifyPass<i> generated from the sensing unit 70. The program bit counter 40 counts the number of data having logic "0" value whenever the latch unit 30 finds data of "0". When the counted value becomes the number of the maximum synchronized program bits or the last scan clock signal ScanCLK<8> is input, the program bit counter 40 generates the synchronous program activation signal BitMax to the scan clock generating unit 20 and the program control unit 50 so as to make the scan clock generating unit 20 generate not the scan clock signal ScanCLK<i> but the program execute signal PgmExecute during programming. The program driver 60 programs the data having a logic "0" value as many as the number of the maximum synchronous program bits in response to the program voltage Vb1 from the high voltage generating unit (not shown) and a program execute signal PgmExecute generated from the program control unit 50. Then, the sensing unit 70 decides whether the program execution in the memory cell is completed to determine whether the semiconductor memory device 100 is reprogrammed or not.

Assume that, for example, the data to program is 8 bits and a maximum number of bits (i.e., the maximum number of synchronous program bits that can be written to memory cells at the same time) is four bits. The operation of the semiconductor memory device 100 according to some embodiments of the present invention may be performed as follows.

Figure 2:
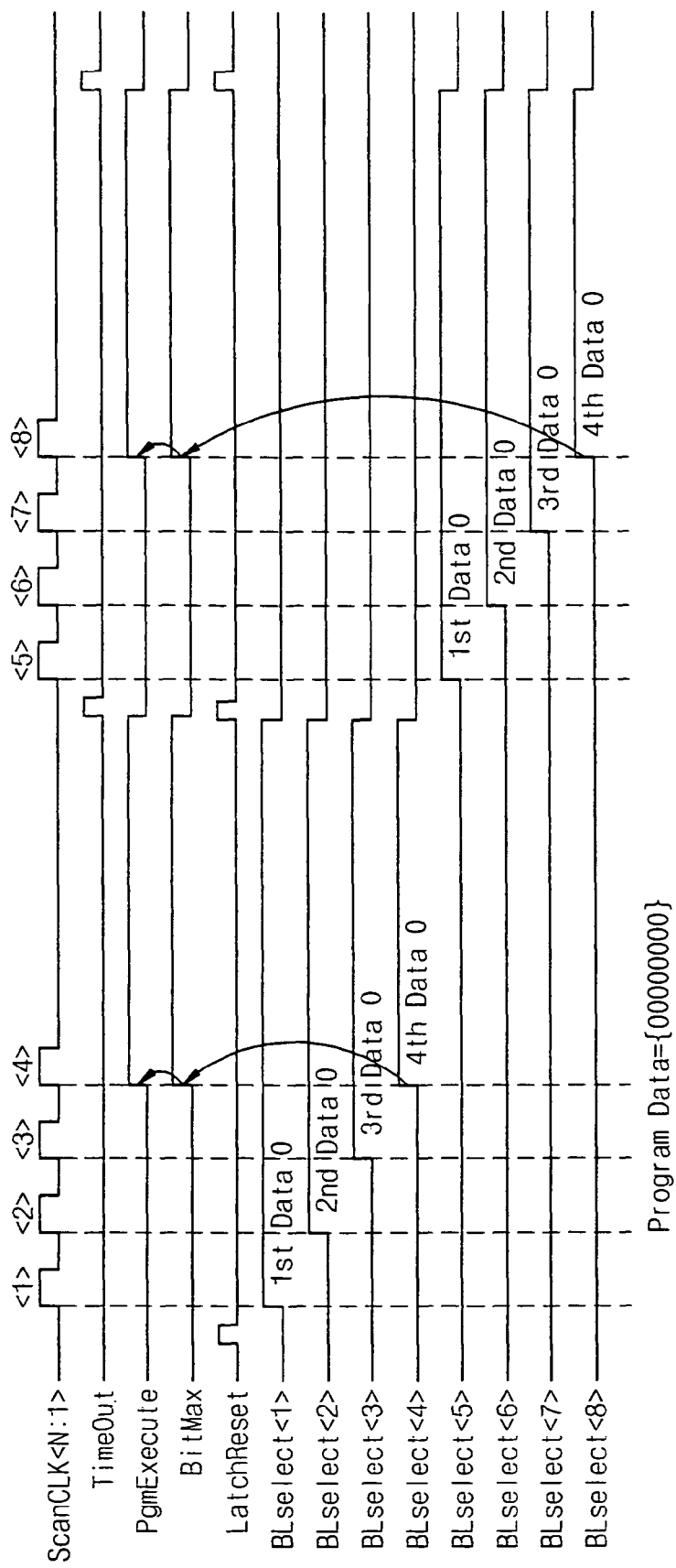
FIGS. 2 and 3 are timing diagrams of operation timing with respect to a bit scanning program that can be carried out in the semiconductor memory device shown in FIG. 1, in accordance with some embodiments of the present invention.
Figure 3:
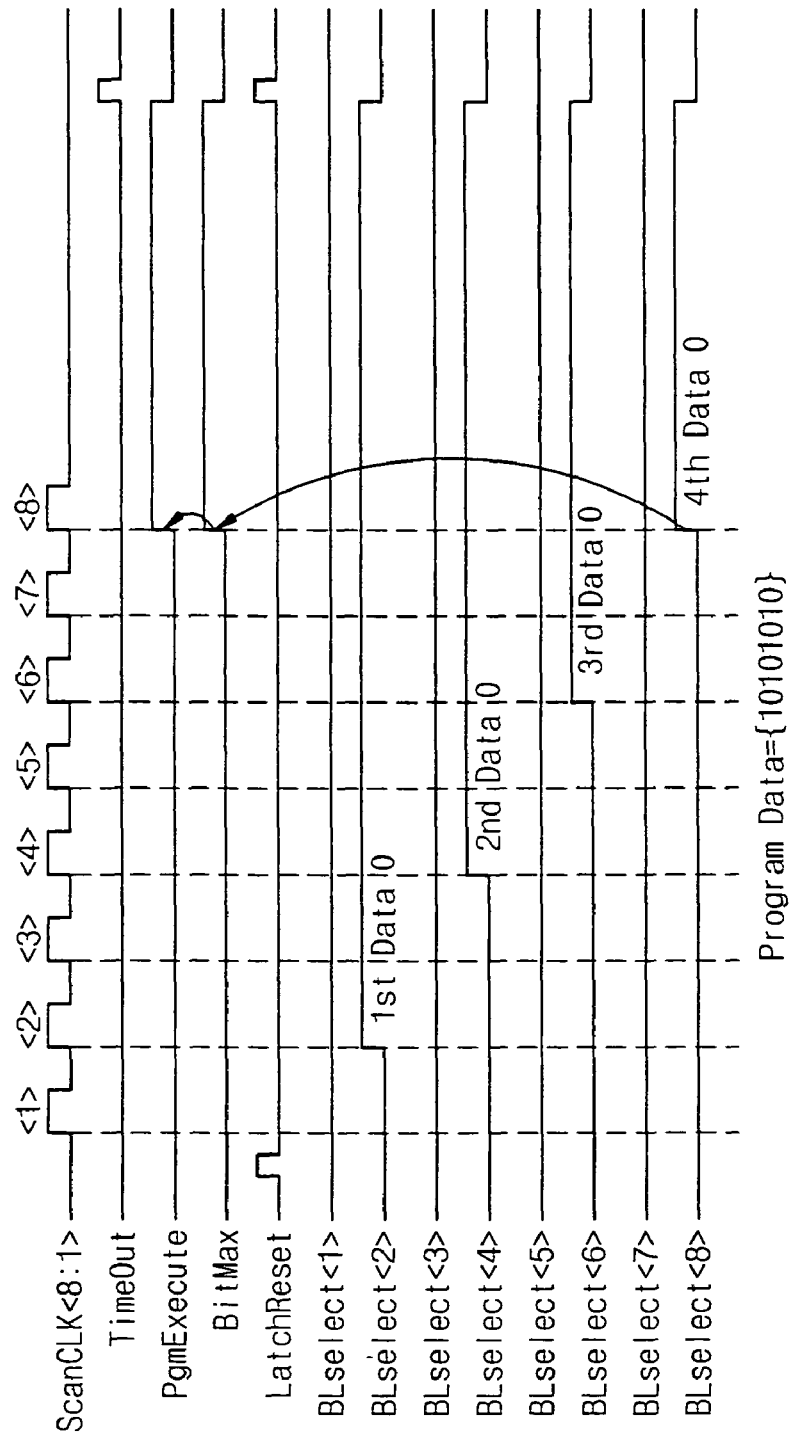

FIGS. 2 and 3 are timing diagrams illustrating operation timings with respect to a bit scanning program that may be executed in the semiconductor memory device 100 in FIG. 1.

Referring to FIG. 2, if the program data Data<N:1> is "00000000", a latch reset signal LatchReset is toggled to initialize the data latch circuits 30a, . . . , 30j. Then, eight scan clock signals ScanCLK<8:1> are toggled sequentially. The latch reset signal LatchReset is periodically generated whenever the program bit counter 40 performs a program. However, the latch reset signal LatchReset is generated from an interface device included in the semiconductor memory device 100 at an initial program to initialize the data latch circuits 30a, . . . , 30j. The verify pass signal VerifyPass<i> is generated from the sensing circuit 70 after the program is executed, but a value thereof is initialized to a low level to make the program executed at the initial program.

After the latch reset signal LatchReset is toggled, each of the data latch circuits 30a, . . . , 30j determines high or low levels of the bit line selection signal and the program count signal PgmCount<i> according to whether each program data Data<i> has a logic "1" or "0" value. For instance, the data latch circuits 30a, . . . , 30j generate an activated bit line selection signal BLselect<i> and an activated program count signal PgmCount<i>, respectively, when the corresponding program data has a logic "0" value. When the corresponding program data has a logic "1" value, an inactivated bit line selection signal BLselect<i> and an inactivated program count signal PgmCount<i>, respectively.

In FIG. 2, a first program data Data<1> has a logic "0" value, such that the first data latch circuit 30a generates an activated first bit line selection signal BLselect<1> and an activated first program count signal PgmCount<1> and latches the corresponding data when a first scan clock signal ScanCL<1> is toggled. A program bit counter 40 performs a count-up operation once in response to the first program count signal PgmCount<1> generated from the first data latch circuit 30a.

Continuously, all of second through fourth program data Data<2>-Data<4> have a logic "0" value, such that the second through fourth data latch circuits generate activated second through fourth bit line selection signals BLselect<2>-BLselect<4> and activated second through fourth program count signal PgmCount<2>-PgmCount<4> while second through fourth scan clock signals ScanCLK<2>-ScanCLK<4> are toggled, and latches the corresponding data. The program bit counter 40 performs count-up operations three times sequentially in response to the second through fourth program count signal PgmCount<2>-PgmCount<4> that are generated from the second through fourth data latch circuits. In addition, when the counted value becomes four that is the maximum number of synchronous program bits, a synchronous program activation signal BitMax is activated, which notifies that the four data to be programmed at the same time are searched all.

When the synchronous program activation signal BitMax is activated, the program control unit 50 activates the program execute signal PgmExecute for notifying the start of program. As a result, a program operation with respect to the first though fourth data Data<1>-Data<4> having a logic "0" value is executed at the same time. While the synchronous program activation signal BitMax is activated, the scan clock generating unit 20 does not generate the scan clock signal until an activation period of the program execute signal PgmExecute is ended. When an activation period of the program execute signal PgmExecute is ended by a program timing control signal Time Out, a latch reset signal LatchReset is toggled once to initialize the programming bit counter 40 and the data latch unit 30. Programming with respect to the rest of the data Data<5> through Data<8> is performed in the same manner as described above.

Referring to FIG. 3, if the program data Data<N:1> is "10101010", only second, fourth, sixth and eighth data Data<2>, Data<4>, Data<6> and Data<8> have a logic "0" value. Therefore, a scanning operation for finding the data of "0" is continued until an eighth bit line selection signal BLselect<8> is activated. That is, programming is not performed until four data of having logic "0" values are found. In some prior art memory devices, data is divided based on a number of bits capable of being programmed at once into memory cells, and programming of the data into the memory cells is carried regardless of the value of the program data. In contrast, in various embodiments of the present invention, programming of data into memory cells is carried out based on which data have logic "0" values, which may reduce the time needed to program the data.

As the number of bits to be programmed increases, the memory device 100 may provide improved programming speed. For example, if program data is input in a word length, and four bits that can be programmed in the memory cells at a same time. In some prior art memory devices, programming may be performed by using four programming cycles of four bits per cycle. In contrast, in accordance with some embodiments of the present invention, if the number of data having logic "0" values is less than four, then programming of the data may be completed by one programming cycle. If the number of data having logic "0" values is between five through eight, then programming of the data may be completed in two programming cycles. If the number of data having logic "0" values is between nine through twelve, then programming of the data may be completed in three cycles. If the number of data having logic "0" values is between if thirteen through sixteen, then programming of the data may be completed in four cycles. Accordingly, per this example, the time needed to program data may be reduced by ¼, based on the number of data having logic "0." values. If the probability that the data has about the same number of logic "0" values as logic "1" values, then the reduction in time needed to program the data may be about 50%.

Figure 4:
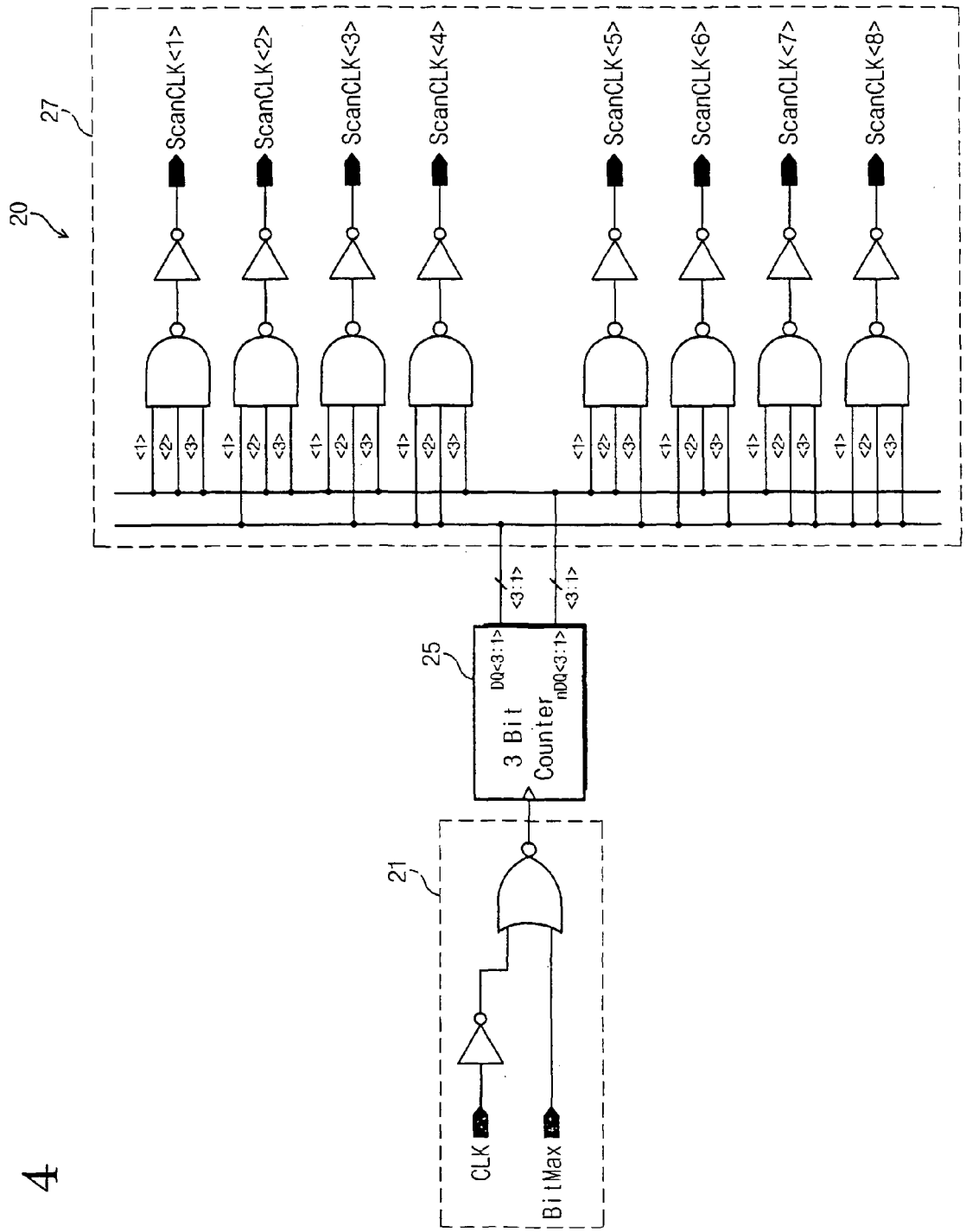
FIG. 4 is a circuit diagram of the scan clock generating circuit shown in FIG. 1, in accordance with some embodiments of the present invention.

FIG. 4 is a circuit diagram of the scan clock generating unit 20 shown in FIG. 1. Referring to FIG. 4, the scan clock generating unit 20 includes a signal input unit 21, a counter unit 25 and a decoder unit 27.

The signal input unit 21 includes an inverter and a NOR gate. The signal input unit 21 carries out a NOR logic operation with respect to an inverse value of an internal clock signal CLK input periodically and a synchronous program activation signal BitMax, and transmits only internal clock signal CLK, which is input until the synchronous program activation signal BitMax, is input to a counter unit 25. The counter unit 25 comprises three-bit counter and counts the numbers of activated pulses of the internal clock signal CLK input from the signal input unit 21. The decoder unit decodes an output of the counter unit 25 to generate a plurality of scan clock signals ScanCLK<1>, . . . , ScanCLK<8> that are sequentially toggled once in each period of the internal clock signal CLK.

The signal input unit 21 generates a signal of low level for the counter unit 25 not to perform a count operation when the synchronous program activation signal BitMax is activated. As a result, the scan clock generating unit 20 stops generating the scan clock signals ScanCLK<1>, . . . , ScanCLK<8> in a program interval while the synchronous program activation signal BitMax is activated. When the synchronous program activation signal BitMax is inactivated again due to an end of the program, the scan clock generating unit 20 counts with respect to the internal clock signal CLK to generate the next scan clock signal.

Figure 5:
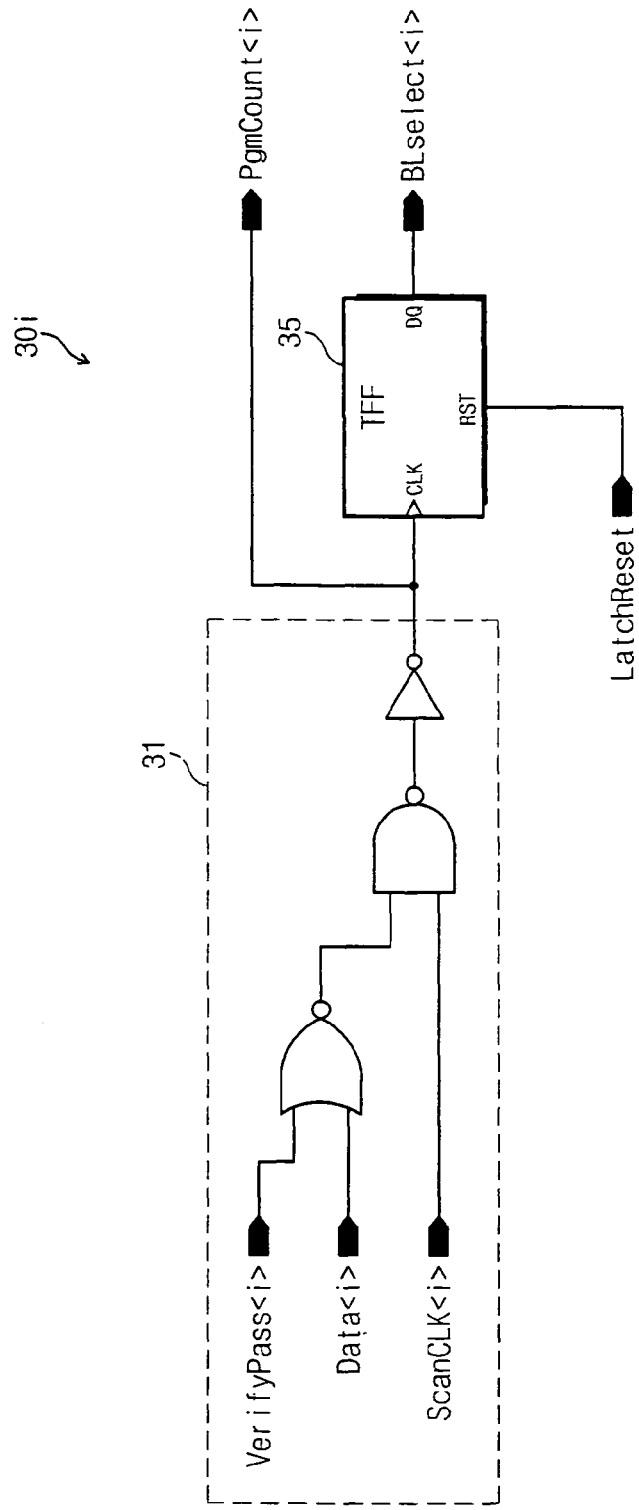
FIG. 5 is a circuit diagram of the data latch circuit shown in FIG. 1, in accordance with some embodiments of the present invention.

FIG. 5 is a circuit diagram of the data latch circuit 30i shown in FIG. 1. Referring to FIG. 5, the data latch circuit 30i includes a data detect unit 31 and a data storage unit 35.

The data detect unit 31 includes a NOR gate, a NAND gate and an inverter. The data detect unit 31 performs a NOR logic operation with respect to the verify pass signal VerifyPass<i> and the program data Data<i>, and a NAND logic operation with respect to the result of the NOR logic operation and the scan clock signal ScanCLK<i>. Then, the data detect unit 31 converts the result of the NAND logic operation to output as the program count signal PgmCount<i>. For example, when the program is performed normally add additional programming is not needed, the activated verify pass signal VerifyPass<i> is input to the data detect unit 31. Thus, an inactivated program count signal PgmCount<i>. When the program is not normally performed and needs reprogramming, the inactivated verify pass signal VerifyPass<i> is input. In this case, if a value of the program data Data<i> is given "0", a program count signal PgrnCount<i> is output, which is activated synchronously with a scan clock signal ScanCLK<i> of the corresponding data in the data detect unit 31.

The data storage unit 35 includes a T-flipflop and serves as a storage for storing data that is detected to have a logic "0" value by the data detect unit 31. When the data Data<i> having a logic "0" value is detected by the data detect unit 31, resulting in generating the activated program count signal PgmCount<i>, the data storage unit 35 receives the program count signal PgmCount<i> as a clock input to generate the activated bit line selection signal BLselect<i>. In accordance with some embodiments of the present invention, only the corresponding bit line selected by the bit line selection signal BLselect<i> is practically programmed. The data storage 35 is initialized in response to a latch reset signal LatchReset generated from the program bit counter 40. This organization prevents the corresponding bits from being programmed further at the next programming. In addition, according to the above reset process, a flip flop is reset to prevent the bits programmed once from being programmed in the next program interval any more. The flip flop is for generating a bit line selection signal BLselect<i> at an initial state of the program mode and right after an execution of the program.

Figure 6:
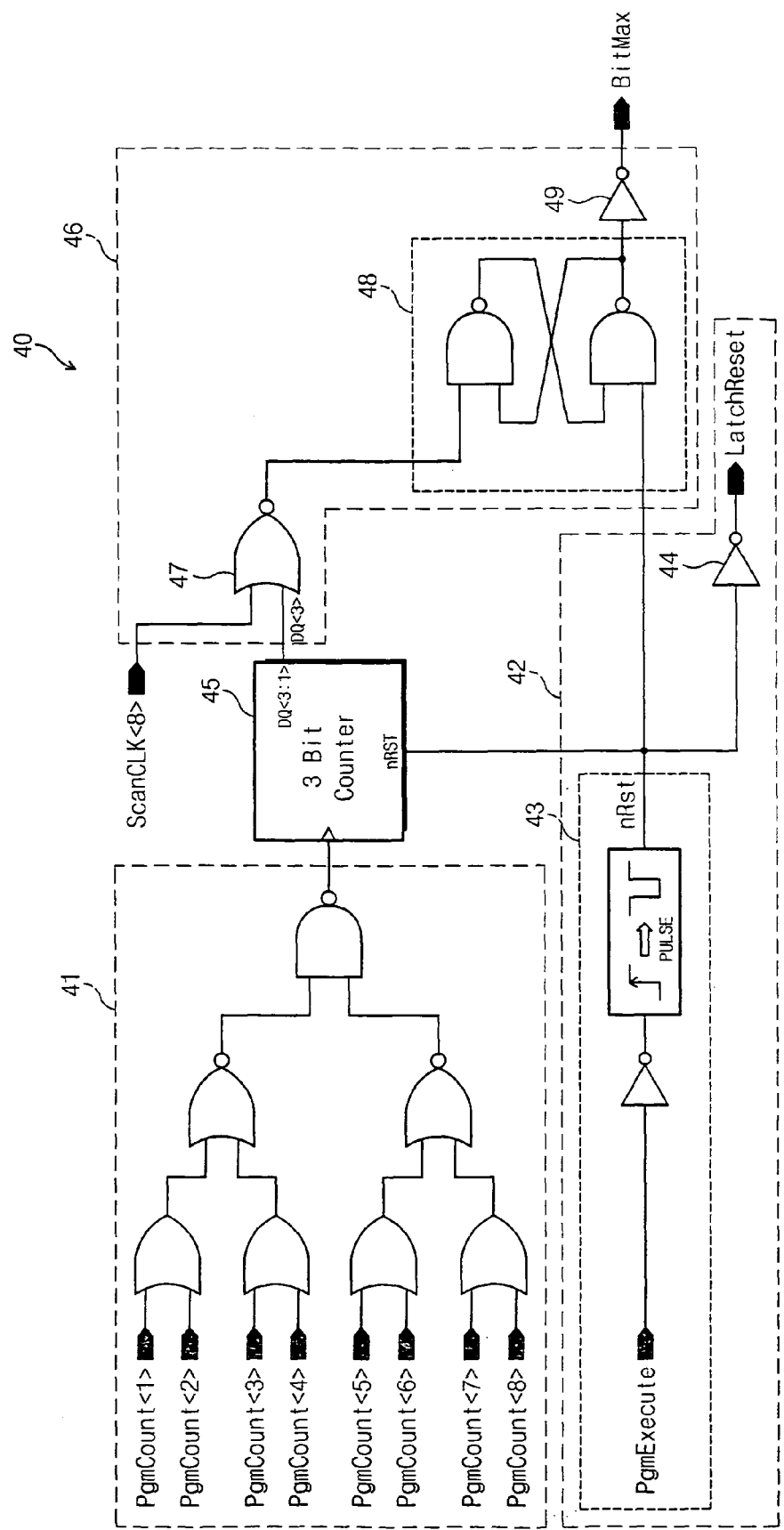
FIG. 6 is a circuit diagram of the program bit counter shown in FIG. 1, in accordance with some embodiments of the present invention.

FIG. 6 is a circuit diagram of the program bit counter 40 shown in FIG. 1. Referring to FIG. 6, the program bit counter 40 includes a signal input unit 41, a reset control unit 42, a counter unit 45 and a data output unit 46.

The signal input unit 41 receives a plurality of program count signals PgmCount<1>-PgmCount<8> generated from the data latch unit 30 and outputs an activated output signal to the count unit 45 if there exists any activated signal. The count unit 45 comprises three-bit counter and determines the number of data to be programmed at the same time by being counted up whenever the activated signal is input from the signal input unit 41 (i.e., the data latch unit 30 searches the data of logic "0" value).

The data output unit 46 determines whether the value counted by the count unit 45 is the same as the maximum number of data that can be written to the memory cells at a same time (e.g., synchronous program bits), or the last scan clock signal ScanCLK<8> is input. If the counted value is the same as the maximum number of data that can be written to the memory cells at a same time or the last scan clock signal ScanCLK<8> is input, the activated synchronous program activation signal BitMax is output. For this, the data output unit 46 includes a NOR gate 47, a latch unit 48 and a first inverter 49. The NOR gate 47 performs a NOR logic operation with respect to an output of the counter unit 45 and the last scan clock signal ScanCLK<8>. The latch unit 48 latches the output signal of the NOR gate 47. The first inverter 49 inverts the output of the latch unit 48 to output.

The reset control unit 42 resets the counter unit 45 based on the program execute signal PgmExecute generated from the program control unit 50 and outputs the inverted value of the program execute signal PgmExecute as a latch reset signal LatchReset. The reset control unit 42 includes a plus generating unit 43 and an inverter 44. The pulse generating unit 43 generates the program execute signal PgmExecute as a pulse activated at a rising edge by means of the inverse value. The inverter 44 inverts the output signal of the pulse generating unit 43 to output as a latch reset signal LatchReset. According to this organization, the program bit counter 40 is capable of counting the number of the program count signals PgmCount<8:1> in a high level state, each input from the eight data latch circuits 30a, . . . , 30j if anyone in the high level state exists. In addition, if the counted value becomes the predetermined number (i.e., the maximum number of synchronous program bits), the activated synchronous program activation signal BitMax is generated. Besides, the program bit counter 40 monitors whether the scan clock signal ScanCLK<8> with respect to the program bit counter 40 is toggled. If the scan clock signal ScanCLK is toggled, the program bit counter 40 generates an activated synchronous program activation signal BitMax to program the searched bits simultaneously even though the counted value does not reaches four bits, that is, the maximum number of data that can be written to the memory cells at a same time (e.g., maximum number of synchronous program bits).

Figure 7:
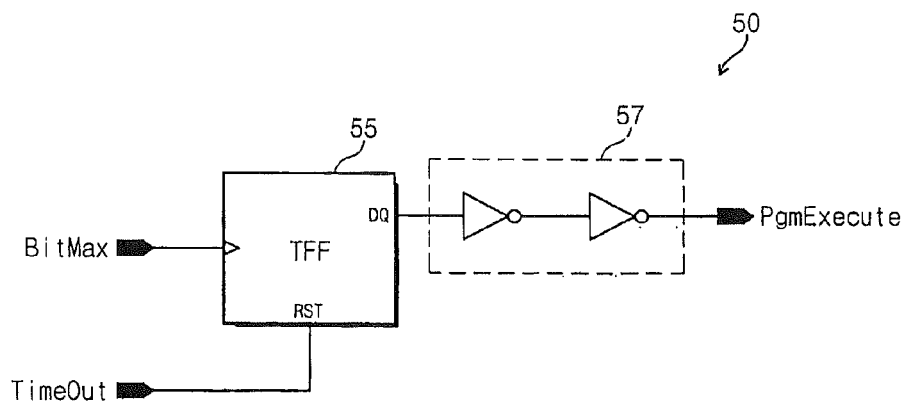
FIG. 7 is a circuit diagram of a program control unit shown in FIG. 1, in accordance with some embodiments of the present invention.

FIG. 7 is a circuit diagram of the program control unit 50 in FIG. 1. Referring to FIG. 7, the program control unit 50 includes a toggling unit 55 and a signal output unit 57.

The toggling unit 55 includes a T-flip flop and receives the synchronous program activation signal BitMax as a clock input terminal and outputs the toggled result. The toggling unit 55 receives the activated synchronous program activation signal BitMax and it is toggled at a rising edge thereof to generate the activated program execute signal PgrnExecute. Then, the signal output unit 57 delays the program execute signal PgmExecute generated from the toggling unit 55 for a predetermine time to output.

Meanwhile, the toggling unit 55 is reset in response to a program timing control signal Time Out input to the reset terminal when a predetermined time elapses after the program execute signal PgmExecute. As a result, the activated program execute signal PgmExecute is inactivated to make the scanning operation for searching the data of logic "0" value performed again.

Figure 8:
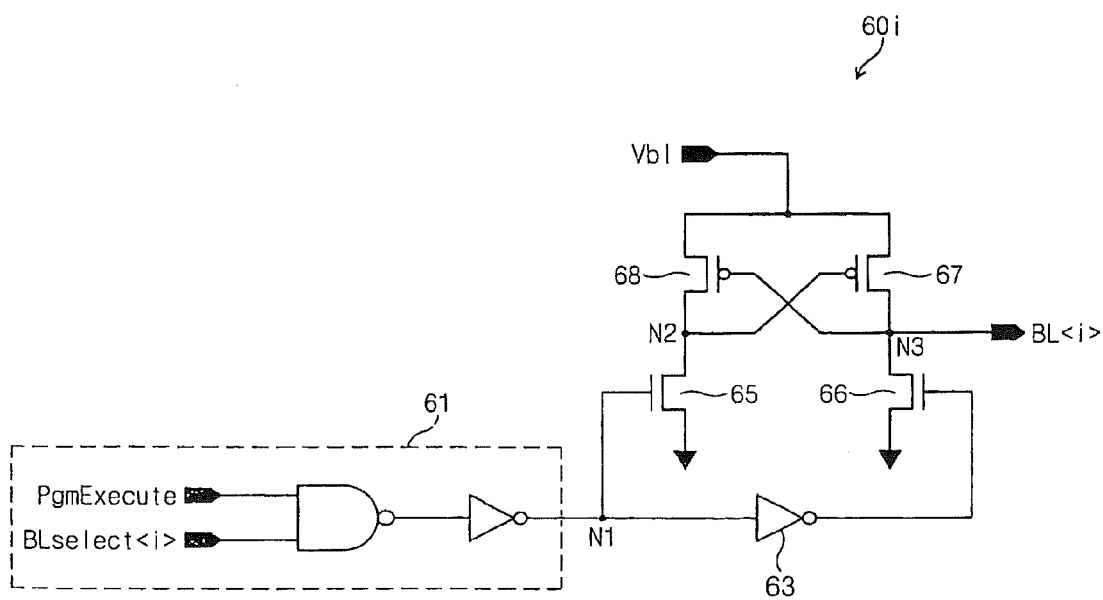
FIG. 8 is a circuit diagram of the program drive circuit shown in FIG. 1.

FIG. 8 is a circuit diagram of the program drive circuit 60$i$ in FIG. 1.

The program drive circuit 60$i$ is for applying a bit line voltage for programming selectively. The program drive circuit 60$i$ serves as a level shifter for applying the high voltage Vb1 for programming to the corresponding bit line BL<i> for a program interval when a corresponding bit line BL<i> is selected by a bit line selection signal BLselect<i>.

Referring to FIG. 8, the program drive circuit 60$i$ detects whether the program execute signal PgmExecute and the bit line selection signal BLselect<i> are all activated, using a data input unit 61 comprising a NAND gate and an inverter. When the two signals are all activated, the program drive circuit 60$i$ generates a signal in a high level state is output to a first node N1. The signal of high level input into the first node N1 is applied to a control gate of a first NMOS transistor 65. The signal applied to the first node N1 is converted to a low level state by the inverter 63 and applied to a control gate of the second NMOS transistor 66.

The first NMOS transistor 65 is turned on by the signal of high level applied to the control terminal, and the second NMOS transistor 66 is turned off by the low level signal input to the control terminal. A voltage level of the second node N2 is lowered to a ground voltage by a discharge operation of the turned-on first NMOS transistor 65. As the voltage of the second node N2 is lowered to a ground level, the signal of low level is applied to the control terminal of the first PMOS transistor 67, resulting in turning on the first PMOS transistor 67.

The voltage level of a third node N3 is raised to the program voltage level Vb1 by a charging operation of the turned-on first PMOS transistor 67. A voltage of the raised third node N3 stays the second PMOS transistor 68 in a turned-off state. As a result, the program voltage Vb1 of high level charged in the third node N3 is provided for a corresponding bit line BL<i> to program a corresponding memory cell.

As explained above, the nonvolatile memory device 100 in accordance some embodiments of the present invention selectively programs data based on the logic value of the data. Consequently, the time needed to program data may be reduced. According some embodiments of the present invention, memory cells are set to logic "1" values before programming, and data having logic "0" values is selected among data that is input to the memory device for programming, and the selected data having logic "0" values is then programmed into the memory cells.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A nonvolatile memory device comprising:
    a memory cell array comprising a plurality of memory cells, wherein each of the memory cells is programmable to store one bit having a first logic value or a second logic value;
    a data scanning unit configured to search among a plurality of data bits that are to be programmed together at a same address of a plural number (M) of the memory cells to identify individual ones of the data bits having the second logic value among other intervening ones of the data bits having the first logic value; and
    a program unit configured to program a plural number (N) of the data bits, which have been identified by the data scanning unit as having the second logic value, at a same time into corresponding ones of the addressed memory cells while at that same time not programming the intervening data bits having the first logic value into the corresponding intervening other ones of the addressed memory cells, wherein the number (N) is less than the number (M),
    wherein the data scanning unit comprises:
    a scan clock generating unit configured to generate a plurality of scan clock signals in response to an internal clock signal; and
    a data latch unit configured to search among the plurality of data bits and to identify individual ones of the data bits having the second logic value responsive to the plurality of scan clock signals.

2. The nonvolatile memory device of claim 1, wherein, in response to the data scanning unit identifying that among M sequential immediately adjacent data bits that are to be programmed into M sequential immediately adjacent memory cells at the same address that N of the M data bits have the second logic value and that the other (M-N) data bits have the first logic value and intervene between at least two of the N data bits having the second logic value, the program unit is configured to program the N data bits having the second logic value at a same time into N corresponding ones of the addressed memory cells while at the same time not programming the intervening (M-N) data bits having the first logic value into the corresponding intervening addressed memory cells between the N memory cells programmed with the N data bits having the second logic value.

3. The nonvolatile memory device of claim 1, wherein the program unit comprises a sensing unit configured to simultaneously read M data bits from M sequential memory cells that have been earlier programmed with the second logic value, and to identify individual ones of the M read data bits presently having the first logic value.

4. The nonvolatile memory device of claim 3, wherein, in response to the data scanning unit identifying that N of the M read data bits have the first logic value and that the other (M-N) read data bits have the second logic value and intervene between the N data bits having the first logic value, the program unit is configured to reprogram at the same time second logic value data bits into the (M-N) memory cells from which the N data bits were read having the first logic value while at the same time not reprogramming the intervening memory cells from which the (M-N) data bits were read having the second logic value.

5. The nonvolatile memory device of claim 1, wherein the scan clock generating unit is configured to stop generation of the scan clock signals for a predetermined program time based on a determination that the number of identified data bits having the second logic value is equal to the number (N) bits that the program unit can program at a same time into the memory cells.

6. The nonvolatile memory device of claim 1, wherein the scan clock generating unit is configured to sequentially activate each of the scan clock signals at predetermined intervals.

7. The nonvolatile memory device of claim 1, wherein the data latch unit comprises:
    a data detecting unit configured to determine for each of the data bits to be programmed whether the data bit has the first logic value or the second logic value responsive to the scan clock signals and to generate an output signal in response thereto; and
    a data storage unit configured to store data bits having the second logic value based on the determination by the data detecting unit, and to output a bit line active signal that activates a bit line corresponding to the stored bits.

8. The nonvolatile memory device of claim 7, wherein the data detecting unit is configured to determine for each data bit to be reprogrammed whether the data bit has the first logic value or the second logic value.

9. The nonvolatile memory device of claim 7, wherein the data storage unit comprises a T-flip flop that is configured to receive the output signal from the data detecting unit as a clock input and to output the bit line active signal in response thereto.

10. The nonvolatile memory device of claim 7, wherein the program unit comprises:
    a program bit counter configured to count a number of the data bits having the second logic value and to not include in the count a number of the data bits having the first logic value in response to the output signal from the data latch unit and the scan clock signals;
    a program control unit configured to control programming of the data bits into the memory cells that corresponds to the activated bit line in response to the number of the data bits counted by the program bit counter as having the second logic value; and
    a program driver configured to program the number (N) of the data bits stored in the data latch into the memory cells at a same time.

11. The nonvolatile memory device of claim 10, wherein the program bit counter is configured to stop counting when a number of counted data bits having the second logic value is equal to the number (N) of the data bits that the program unit can program into the memory cells at a same time.

12. The nonvolatile memory device of claim 10, wherein the program control unit is configured to cause the program unit to program the data bits into the memory cells via a program execute signal when the program bit counter has counted the number (N) data bits having the second logic value that that the program unit can program into the memory cells at a same time.

13. The nonvolatile memory device of claim 12, wherein the program bit counter comprises:
- a data input unit configured to receive an indication from the data scanning unit when one of the data bits is identified as having the second logic value;
- a counter unit configured to increment a count of a number of the data bits having the second logic value to be programmed at the same time into the memory cells and to not include in the count a number of the data bits having the first logic value;
- a data output unit configured to output an activated synchronous program active signal in response to the value counted by the counter unit becoming equal to the number (N) data bits that the program unit can program into the memory cells at a same time or responsive to an indication that a last scan clock signal has been received by the program unit; and
- a reset control unit configured to reset the data latch unit in response to the program execute signal generated by the program control unit, and to reset the counter unit in response to at least in part the program execute signal.

14. The nonvolatile memory device of claim 1, wherein, in response to the data scanning unit identifying that among M sequential data bits that are to be programmed at the same address that the M data bits have sequentially alternating first and second logic values, the program unit is configured to program the N data bits having the second logic value at a same time into N corresponding ones of the addressed memory cells while at the same time not programming the (M-N) data bits having the first logic value into corresponding ones of the addressed memory cells between the N memory cells programmed with the N data bits having the second logic value.

15. A method of programming a nonvolatile memory having a memory cell array of a plurality of memory cells each of which is programmable to store one bit having a first logic value or a second logic value, the method comprising:
- searching among a plurality of data bits that are to be programmed together at a same address of a plurality number (M) of the memory cells to identify individual ones of the data bits having the second logic value among other intervening ones of the data bits having the first logic value; and
- programming a plural number (N) of the data bits, which have been identified by the search as having the second logic value, at a same time into corresponding ones of the addressed memory cells while at that same time not programming the intervening data bits having the first logic value into the corresponding intervening other ones of the addressed memory cells, wherein the number (N) is less than the number (M)), wherein the searching comprises:
- generating a plurality of scan clock signals in response to an internal clock signal; and
- searching among the plurality of data bits to identify individual ones of the data bits having the second logic value responsive to the plurality of scan clock signals.

16. The method of claim 15, wherein the programming further comprises:
- responding to the searching identifying that among M sequential immediately adjacent data bits that are to be programmed into M sequential immediately adjacent memory cells at the same address that N of the M data bits have the second logic value and that the other (M-N) data bits have the first logic value and intervene between at least two of the N data bits having the second logic value, by programming the N data bits having the second logic value at a same time into N corresponding ones of the addressed memory cells while at the same time not programming the intervening (M-N) data bits having the first logic value into the corresponding intervening (M-N) addressed memory cells between the N memory cells programmed with the N data bits having the second logic value.

17. The method of claim 15, wherein the programming further comprises:
- responding to the searching identifying that among M sequential data bits that are to be programmed at the same address that the M data bits have sequentially alternating first and second logic values, by programming the N data bits having the second logic value at a same time into N corresponding ones of the addressed memory cells while at the same time not programming the (M-N) data bits having the first logic value into corresponding ones of the memory cells between the N addressed memory cells programmed with the N data bits having the second logic value.

* * * * *